(12) United States Patent
LeChevalier (10) Patent No.: US 6,356,221 B1
(45) Date of Patent: Mar. 12, 2002

(54) ELECTRON BEAM ANALOG TO DIGITAL CONVERTER INCLUDING TIME SAMPLING OF THE INPUT SIGNAL

(75) Inventor: Robert E. LeChevalier, Golden, CO (US)

(73) Assignee: Northrop Grumman Corporation, Los Angeles, CA (US)

( * ) Notice: Subject to any disclaimer, the term of this patent is extended or adjusted under 35 U.S.C. 154(b) by 0 days.

(21) Appl. No.: 09/641,393

(22) Filed: Aug. 18, 2000

Related U.S. Application Data (60) Provisional application No. 60/149,718, filed on Aug. 20, 1999.

(51) Int. Cl.[7] .......................... H03M 1/62; H03M 1/84; H03M 1/88
(52) U.S. Cl. ...................... 341/137; 341/131; 341/155; 341/135; 341/110; 341/138; 341/137
(58) Field of Search .................... 341/137, 110, 341/135, 155, 131, 138

(56) References Cited

U.S. PATENT DOCUMENTS

| | | | | |
|---|---|---|---|---|
| 4,005,408 A | * | 1/1977 | Taylor et al. | 341/137 |
| 4,185,274 A | * | 1/1980 | Giallorenzi | 341/137 |
| 5,142,285 A | * | 8/1992 | Li et al. | 341/137 |
| 6,297,758 B1 | * | 10/2001 | Sternowski | 341/137 |

* cited by examiner

Primary Examiner—Michael Tokar
Assistant Examiner—Lam Thanh Mai (57) ABSTRACT

An electron beam analog to digital converter wherein an input signal to be quantized is applied to the deflection circuitry of an electron beam generation device where the electron beam is made to sweep an angle proportional to the amplitude of the input signal in a first orthogonal direction (horizontal) across a linear array of detector elements which generates an output signal at the angle of deflection. A sinusoidal reference signal is simultaneously applied to a second set of deflection plates which causes electron beam to sweep in a second orthogonal direction (vertical) whereupon the deflected electron beam periodically sweeps across the detector array and a time sample of the output voltage is generated during a crossover interval. The detection voltage is then converted to an output signal having a binary value corresponding to the amplitude of the analog input signal.

15 Claims, 7 Drawing Sheets

SIMPLE PULLUP
NO CURRENT GAIN

*FIG. 10B*

HBT CASCODE

*FIG. 10C*

CMOS CASCODE

ELECTRON BEAM ANALOG TO DIGITAL CONVERTER INCLUDING TIME SAMPLING OF THE INPUT SIGNAL

This is a conversion of provisional application No. 60/149,718, filed on Aug. 20, 1999 to a non-provisional application.

BACKGROUND OF THE INVENTION

1. Field of the Invention

This invention relates generally to analog to digital converters and more particularly to an electron beam analog to digital converter which incorporates ultra-high speed sampling of the input signal by electron beam deflection.

2. Description of Related Art

Electron beam analog to digital conversion (EBADC) typically involves a cathode ray tube or oscilloscope which operates by deflecting electron beams proportional to the amplitude of the signal being converted. In a conventional implementation of such an analog to digital converter, the deflection angle of an electron beam is measured with a linear array of detector elements which is then converted from a thermometer-like code into a conventional binary format. Such apparatus is shown, for example in FIG. 1.

Figure 1:
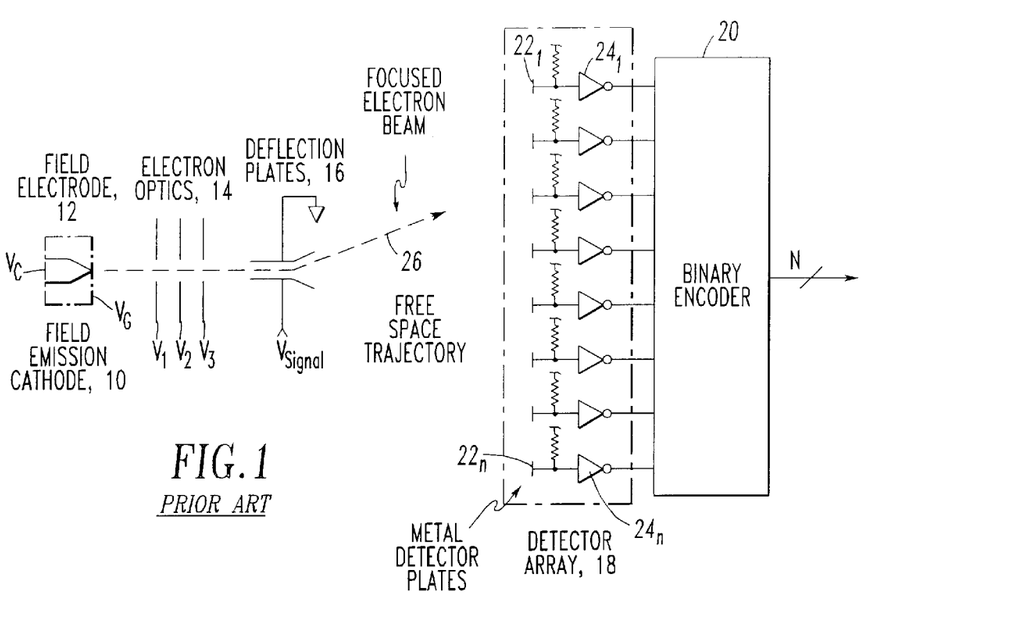
FIG. 1 is an electrical diagram illustrative of a conventional electron beam analog to digital converter.

Referring now to FIG. 1, shown thereat is a field emission cathode 10, field electrode 12, electron optics 14, deflection plates 16, a linear detector array and a binary encoder 20 The detector array 18 additionally includes a plurality of detector elements $22_1 \ldots 22_n$ consisting of metal and/or semiconductor detector elements which are coupled to secondary gain or logic amplifiers which may be, for example, inverter type buffer amplifiers $24_1 \ldots 24_n$ having a predetermined gain. An input signal $V_{signal}$, when applied to the deflection plates 16, causes a deflection of a focused electron beam 26 to strike at least one, but typically two or more of the detector elements 22. This constitutes a measure of the amplitude of the signal $V_{signal}$. The detector element(s) 22 amplify the beam current, if necessary, by an amount sufficient to drive secondary gain or logic amplifiers $24_1 \ldots 24_n$ but in any case the detector array 18 produces an output which is fed to the binary encoder 20 and which in turn outputs an N bit binary signal corresponding to the amplitude of the input signal $V_{signal}$.

The advantage of such an approach is that the deflection process is inherently linear and possesses extremely high bandwidth. Moreover, if the size can be reduced such that the deflection plates are as little as a few microns long even at modest beam energies of, for example, 30 v, the bandwidth can be as high as 300 GHz.

SUMMARY

Accordingly, it is an object of the present invention to provide an improvement in analog to digital signal converters.

It is a further object of the invention to provide a high resolution, high speed analog to digital converter including ultra-high speed sampling of the analog input signal.

It is yet another object of the invention to provide an electron beam deflection analog to digital converter having extremely low timing jitter, high linearity, low power and radiation hardness.

These and other objects are achieved by a method and apparatus wherein a signal to be quantized is applied to the deflection circuitry of a cathode ray generation device where the electron beam is made to sweep an angle proportional to the signal amplitude in a first orthogonal direction across a linear array of detector elements. A periodic reference signal, preferably a sinusoidal signal, is applied to a second set of deflection plates which act to direct the electron beam in a second orthogonal direction causing the electron beam to sweep across the detector array where it generates a time sample of the input voltage at the crossovers. The detection voltage is then converted to an output signal having a binary value corresponding to the analog input value.

One aspect of the invention is directed to an electron beam analog to digital converter, comprising: an electron beam former generating an electron beam; an array of electron beam detector elements located in the path of the electron beam; first electron beam deflecting apparatus responsive to an analog input signal for deflecting the beam in a horizontal direction across the detector elements to a location proportional to the amplitude of the input signal, the electron beam exciting at least one of said detector elements which thereby generates an output signal indicative of the deflected beam angle; second electron beam deflecting apparatus responsive to a periodic reference signal for simultaneously deflecting the beam in a vertical direction across the detector elements causing a time sample of the detected input signal to be generated of the input signal during a crossover time interval; and a binary encoder coupled to the output signal and generating a binary output signal corresponding to the time sample of the input signal.

Another aspect of the invention is directed to a method of converting an analog signal to a digital signal, comprising the steps of: generating an electron beam; locating an array of electron beam detector elements in the path of the electron beam; deflecting the beam in a first direction across the detector elements to a location proportional to the amplitude of the input signal; simultaneously deflecting the beam in a second direction across the detector elements in response to a periodic reference signal; exciting at least one of said detector elements and an output signal indicative of the deflected beam angle; generating an output signal corresponding to a time sample of the input signal during a crossover time interval of the electron beam when deflected across the detector elements; and generating a binary output signal corresponding to the time sample of the input signal.

Further scope of applicability of the present invention will become apparent from the detailed description which is provided hereinafter. It should be understood, however, that the detailed description and specific examples, while disclosing the preferred embodiment of the invention, are provided by way of illustration only, since various changes and modifications and alterations coming within the spirit and scope of the invention will become apparent to those skilled in the art from this detailed description.

BRIEF DESCRIPTION OF THE DRAWINGS

The present invention will become more fully understood when the detailed description is considered in light of the accompanying drawings which are provided by illustration only, and thus are not meant to be considered in a limiting sense, and wherein.

DETAILED DESCRIPTION OF THE INVENTION

Having shown and described in FIG. 1 what is considered to be a conventional electron beam deflection analog to digital converter, one of the advantages of such an analog to digital converter is the extremely high speeds attainable, for example, 100 giga-samples-per-second or more. This provides a rate unequaled by any known circuit based approach. However, a large portion of this bandwidth potential is possible only when the physical size of the deflection system is reduced to extremely small dimensions, e.g., a few microns at most when the beam energy is under 100 eV. In such apparatus, the small deflection plate geometries reduce the time of flight of electrons in the free space trajectory to the detector elements $22_1 \ldots 22_n$.

Figure 2:
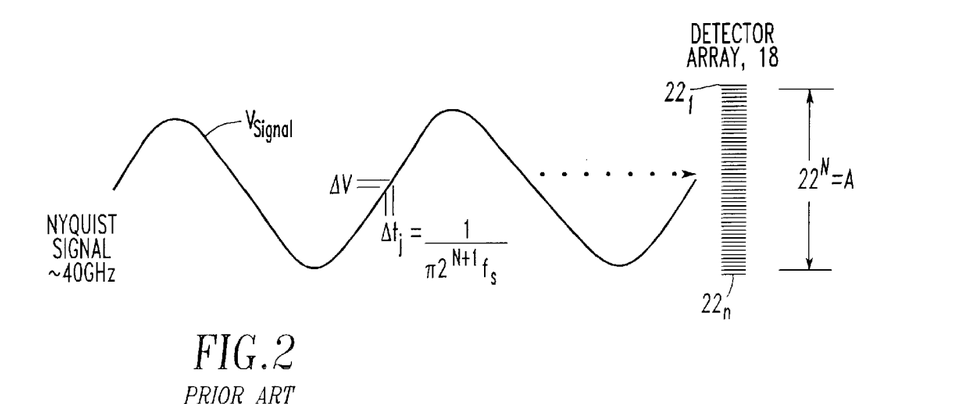
FIG. 2 is a diagram illustrative of jitter being introduced by the prior art shown, for example, in FIG. 1.

It should be noted that in any analog to digital conversion involving the measurement of a high frequency signal, the signal may change substantially during the measurement interval. This is depicted, for example, as shown in FIG. 2, where an input signal $V_{signal}$ having a frequency of, for example, 40 GHz is applied to the deflection plates 16. Accordingly, a ΔV occurs during the time interval $\Delta t_j$ curve when the beam 26 is applied to the electrode array 18. This causes an ambiguity in the measured amplitude and resolution is severely limited unless some means is employed to hold the signal constant over the measurement interval.

Figure 3:
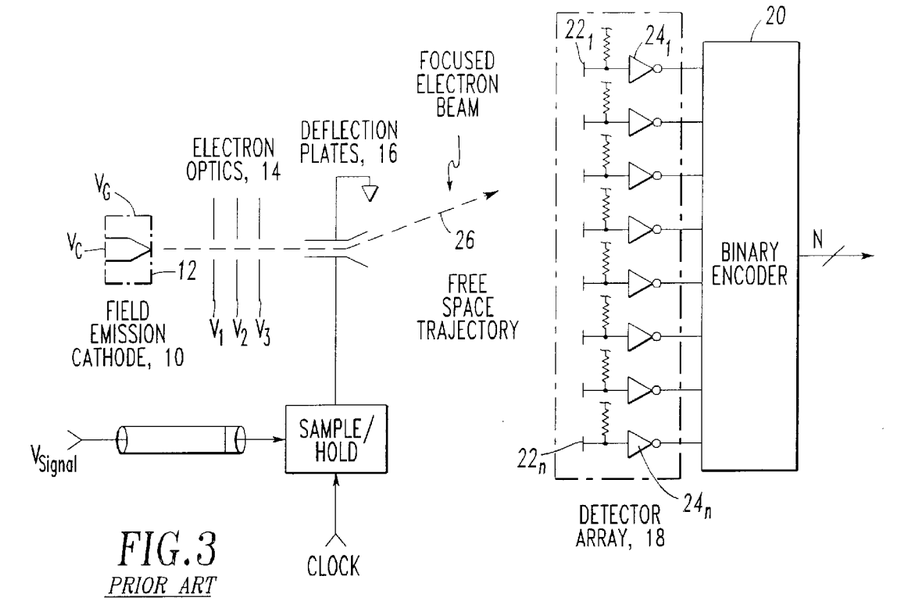
FIG. 3 is an electrical diagram illustrative of a known approach for reducing jitter in an electron beam deflection analog to digital converter.

In the past, this has been accomplished by the inclusion of a conventional sample and hold circuit 28, shown in FIG. 3, which is coupled between the input signal $V_{signal}$ and the deflection plates 16. Details of the sample and hold circuit 28 is shown in FIG. 4 being comprised of an electrically operated switch 30 and a capacitor 32 which is utilized to store the amplitude of the $V_{signal}$ when the switch 30 is closed.

Figures 4, 5:
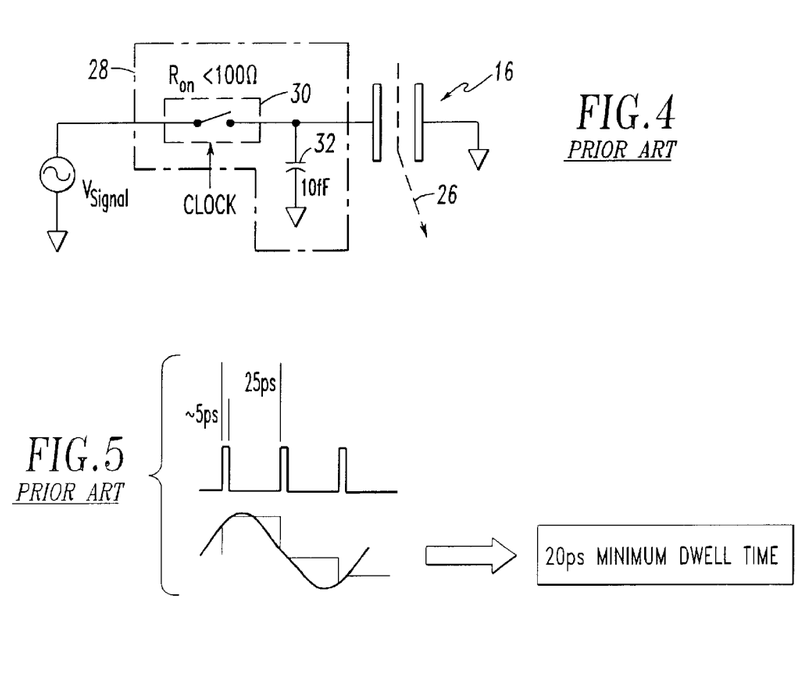
FIG. 4 is an electrical circuit diagram illustrative of the sample/hold circuit shown in FIG. 3.
FIG. 5 is a set of waveforms helpful in understanding the operation of the sample/hold circuit shown in FIG. 4.

However, a sample and hold circuit based on an electronic switch such as shown in FIG. 4 has many drawbacks. For example, when operated at a sampling rate in response to a clock signal having a frequency as high as 100 GHz, the switch 30 must exhibit an extremely low resistance and be fast acting, capable of turning on in a picosecond ($1 \times 10^{-9}$ sec.) or less. It must also turn off even faster, e.g., about 10–100 femtoseconds ($1 \times 10^{-12}$ sec.), or else the level being stored and held by the capacitor 32 will depend on the slew rate of the signal.

Furthermore, a fast acting switch requires a timing signal with rise/fall times comparable to the switching interval as shown for example in FIG. 5, where, for example, a 5 picosecond clock pulse is shown being applied with a 25 picosecond interval. Fast timing signals meeting such requirements are difficult to generate and require substantial power. Furthermore, they must exhibit extremely low jitter, around 1 femtosecond, for a 10 bit resolution in a 100 GHz analog to digital converter. The only way known at present to generate a timing reference with this level of jitter is by means of a sinusoidal RF oscillator. However, the rise/fall times of such a waveform are inappropriate for driving such a switch.

Figure 6:
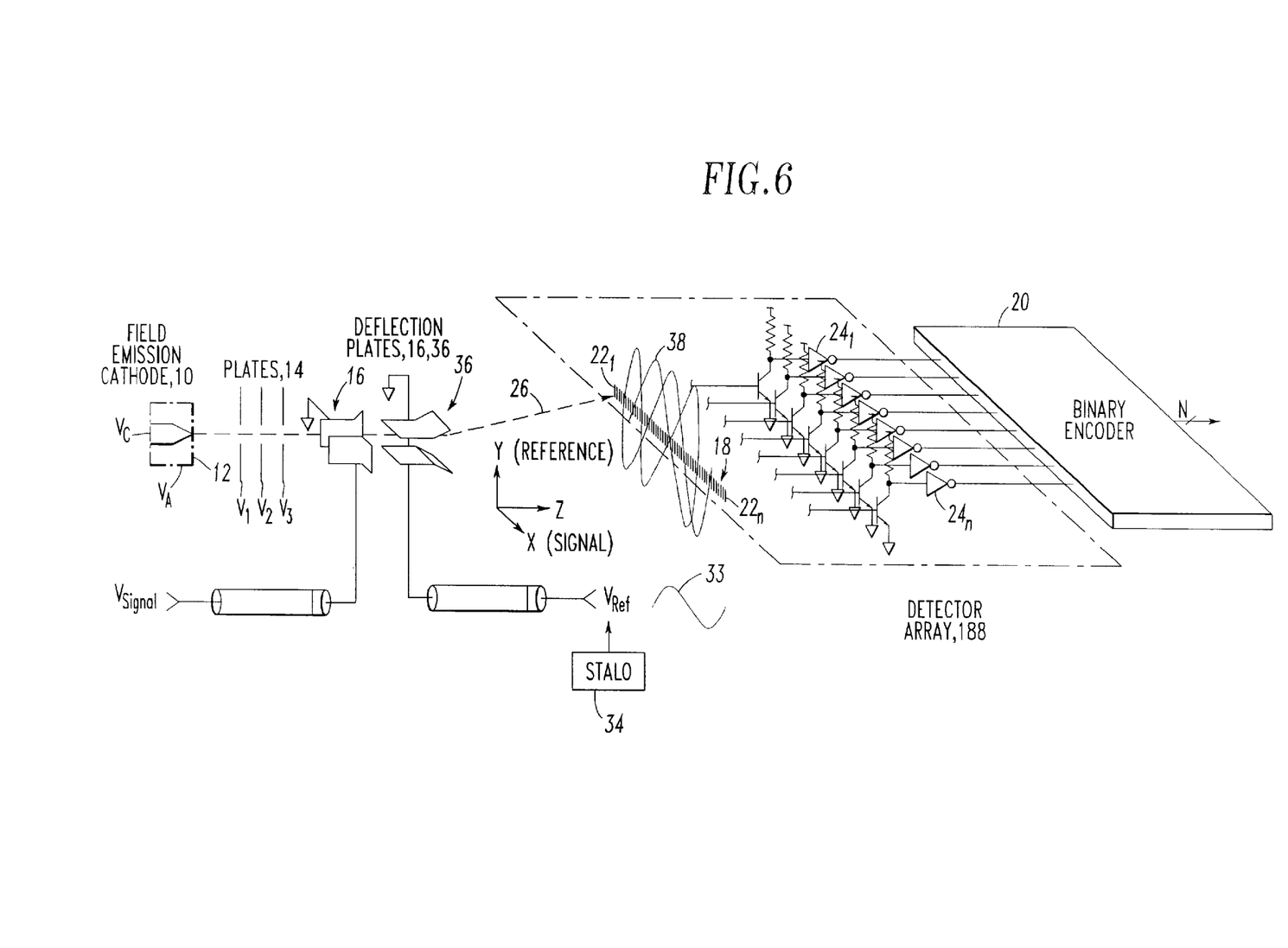
FIG. 6 is an electrical diagram illustrative of the preferred embodiment of the subject invention.
Figure 7:
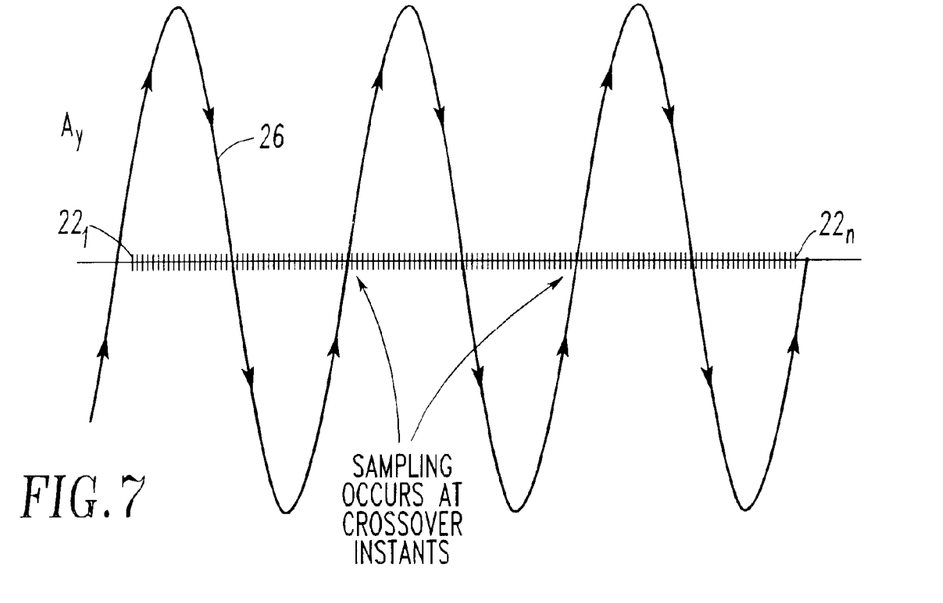
FIG. 7 is a front plan view illustrative of the beam deflection provided across a linear detector array to provide deflection sampling in accordance with the subject invention.

This now leads to a consideration of the preferred embodiment of the invention which is shown in FIG. 6 and discloses a high speed sampling mechanism that can be incorporated into the deflection system of an electronic beam analog to digital converter (EBADC). The present invention as shown in FIG. 6 includes a second set of deflection plates 36 which are oriented orthogonally with respect to the signal measurement deflection plate 16 and which sweep the electron beam 26 on an off of the linear array of substantially equally spaced detector elements $22_1 \ldots 22_n$, for example, a vertical direction as shown in FIG. 7 as the beam 26 also sweeps horizontally (FIG. 8) to measure the angle of the deflected beam in response to the input $V_{signal}$. As show in FIG. 6, a sinusoidal reference signal ($V_{ref}$)33 generated by a stable oscillator 34, is applied to the deflection plates 36. While the deflection plates 36 are shown being located forward of the deflection plates 38, when desirable, their positions may be reversed. Although any type of periodic signal may be utilized as the reference signal $V_{ref}$, a sinusoidal reference signal is preferable, since the lowest possible sampling jitter is provided thereby and all other difficulties attendant with generating a more traditional voltage timing reference, such as a square wave, are eliminated, including harmonic generation, EMI cross, talk.

Accordingly, when a reference signal 33 such as a pure sinusoid is applied to the deflection plates 36, and has a voltage amplitude which is much greater or less than its midpoint value as shown in FIG. 7, it deflects the beam 26 vertically off the linear set of detector elements $22_1 \ldots 22_n$, irrespective of the horizontal angle imparted to the beam by the deflection plate 16 in response to the $V_{signal}$. It is only when the timing reference signal $V_{ref}$ is near its midpoint value, does the beam 26 excite some portion of the electrode array 18.

Figure 8:
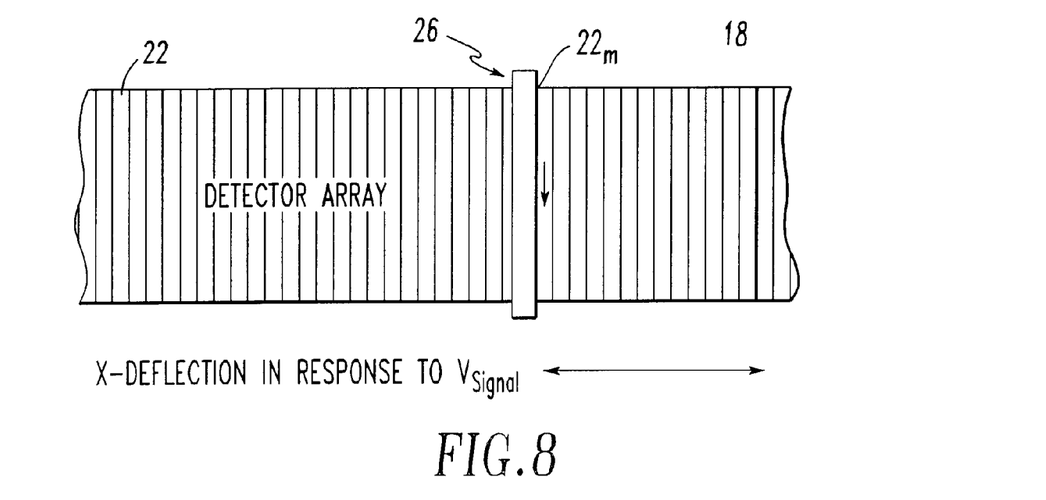
FIG. 8 is further illustrative of the deflection sampling process shown in FIG. 7.

Thus if the vertical deflection plates 36 have sufficient angular gain for an applied reference signal $V_{ref}$, the beam 26 will only dwell on any single detector element position in the linear array of detector elements $22_1 \ldots 22_m$ for a very brief instant as shown in FIGS. 7 and 8. By using circuitry shown by way of example in FIG. 6 such as a plurality of bipolar transistors $23_1 \ldots 23_4$ connected to the detector elements $22_1 \ldots 22_n$ and a plurality of inverter amplifiers $24_1 \ldots 24_n$ connected to the encoding logic 20 circuitry, the horizontal angular position of this momentary event can be detected. The beam 26 sweeping across one or more detector elements 32, moreover, provides a sampling operation. Since a sampling interval generates a very brief current as the beam 26 sweeps past a detector element $22_m$, there is little energy to detect. This is illustrated in FIG. 9.

Figure 9:
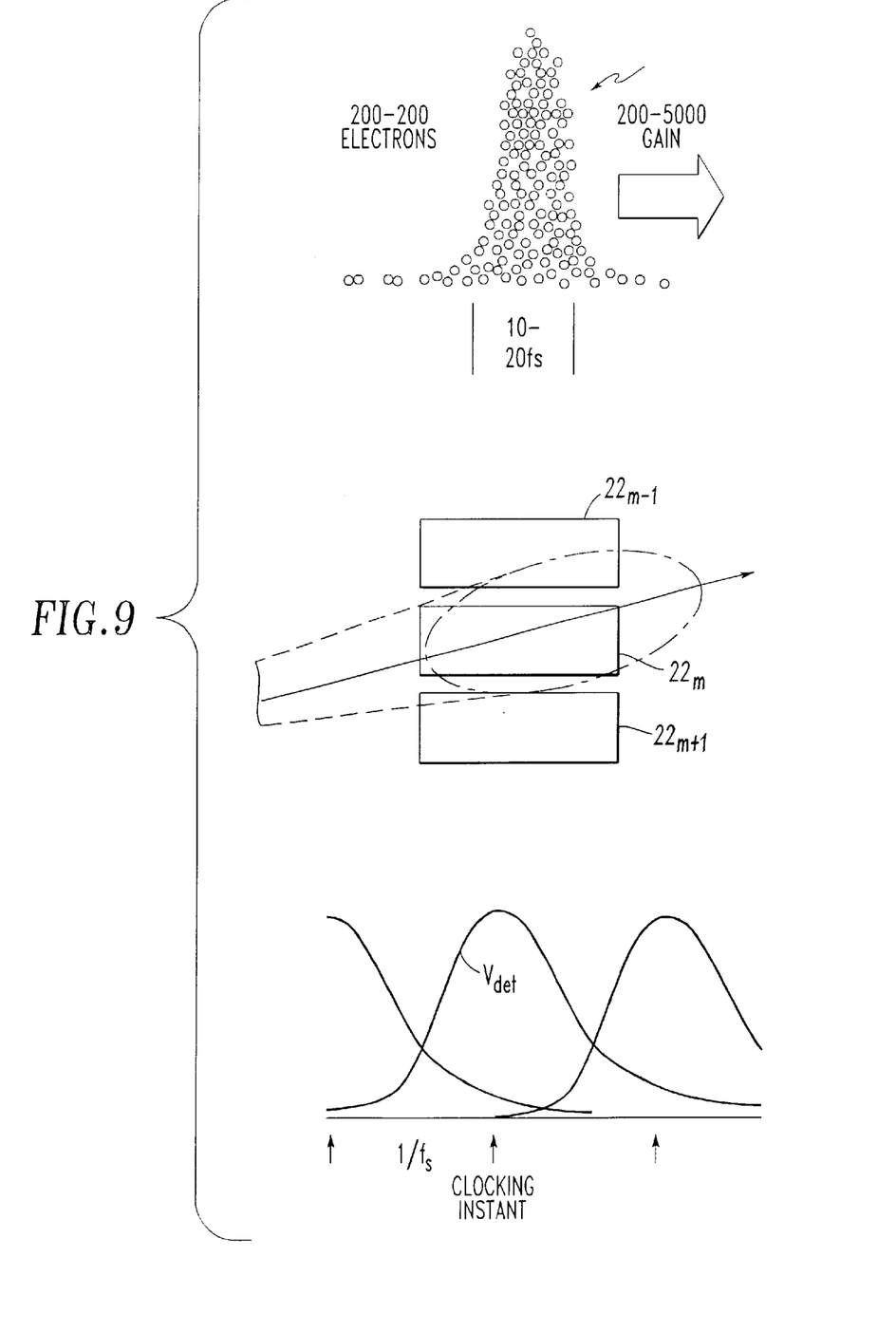
FIG. 9 is a diagram further illustrative of the deflection sampling process provided by the subject invention.

Considering now FIG. 9, when the frequency of the reference signal $V_{ref}$ (FIG. 6) is on the order of 100 GHz or more, the dwell time on radiated detector element(s) 22 can be as little as 10 femtoseconds. For a reasonable beam current of about 1 ma for the electron beam, no more than 100 electrons might impinge on a single electrode $22_m$ as shown. The detected voltage $V_{dt}$ shown in FIG. 9 is normally too small to drive a high speed logic gate, not shown, in the encoding logic 20 (FIG. 6) and therefore the electron current, shown by reference numeral 40, may have to be amplified in some manner, although depending on the type of detector element 22 utilized, amplification may be unnecessary. Although no specific means is essential for implementing the subject invention, the examples shown in FIGS. 10A–10D comprise illustrative embodiments of circuitry provided between the detector elements $22_1 \ldots 22_n$ and the encoding logic. All that is required is that the electron signal be at to a level that the logic in the analog to digital encoder 20, shown in FIG. 6, can sense.

Figures 10A, 10B:
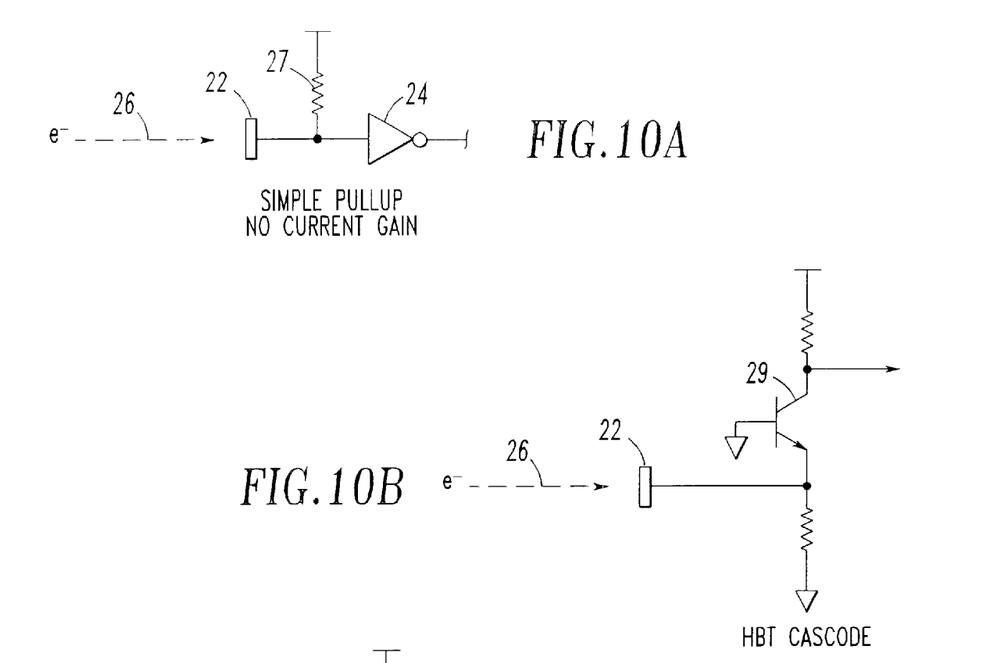
FIGS. 10A–10D depict various types of amplification devices which can be used with the embodiment of the invention shown in FIG. 6.
Figure 10C:
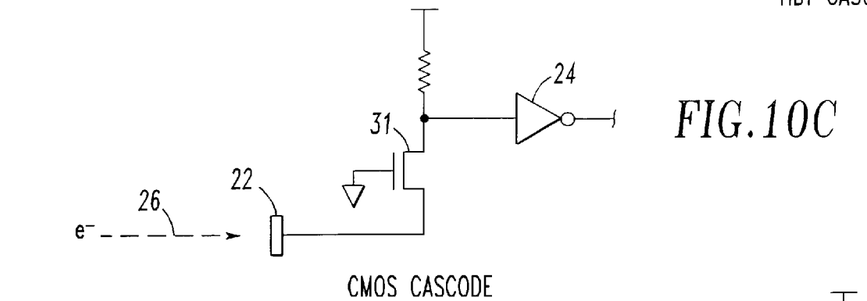
Figure 10D:
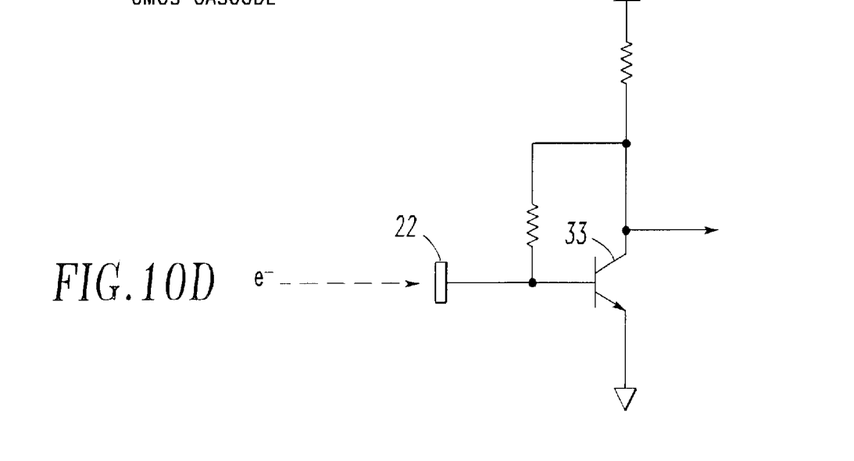

For example, FIG. 10A is illustrative of a buffer amplifier 24 having unity gain including a single pull-up resistor 27. Such a circuit combination is utilized in the prior art arrangement shown in FIGS. 1 and 3. FIG. 10B is illustrative of amplification being provided by a common base transistor amplifier including a heterojunction bipolar (HBT) npn transistor 29 which is connected in cascode circuit relationship to a detector element 22 via its emitter electrode. FIG. 10C depicts a common gate CMOS field effect transistor amplifier circuit including an npn device 31 having its source electrode connected to the detector element 22 while the drain electrode is connected to a buffer amplifier 24. FIG. 10D depicts a common emitter transistor amplifier including an HBT 33 where the detector element 22 is connected to the base electrode and its output connected to an encoding device via its collector electrode.

Figure 11:
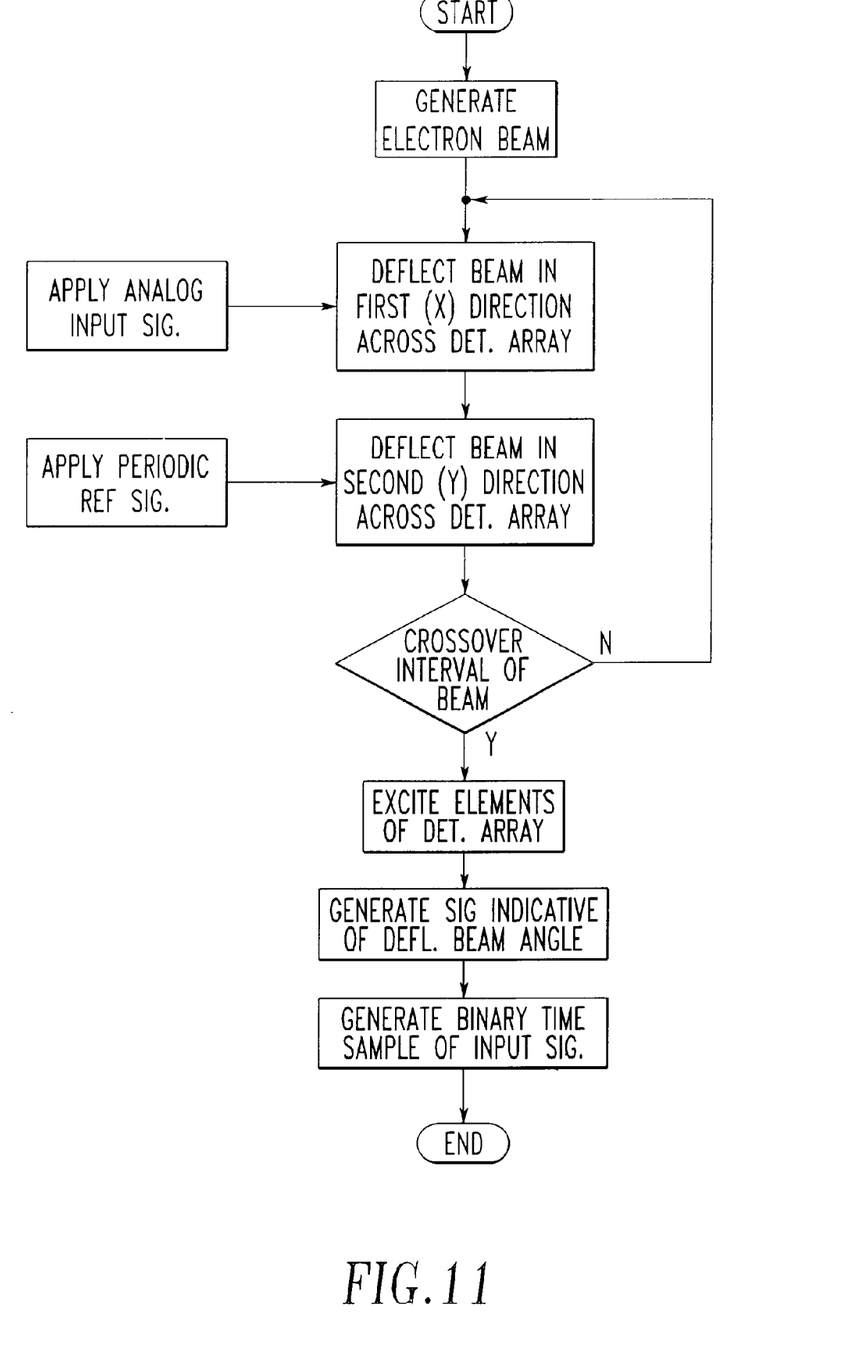
FIG. 11 is a flow chart illustrative of the method of converting an analog signal to a digital signal in accordance with the subject invention.

The flow chart shown in FIG. 11, which is self explanatory, depicts the method of converting an analog signal to a digital signal in accordance with the subject invention and as implemented bt apparatus shown and described with respect to FIGS. 6–9.

Thus what has been shown and described is an ultra-high speed sampling type of analog to digital converter.

Having thus shown and described what is considered to be the preferred embodiment of the invention, it should be noted that the same has been made by way of illustration and not limitation. Accordingly, all modifications, alterations and changes coming within the spirit and scope of the invention as set forth in the appended claims are herein meant to be included.

What is claimed is:

1. An electron beam analog to digital converter, comprising:
   an electron beam former generating an electron beam;
   an array of substantially equally spaced electron beam detector elements located in the path of the electron beam;
   first electron beam deflecting apparatus responsive to an analog input signal for deflecting the beam in a first direction across the detector elements to a location proportional to the amplitude of the input signal, the electron beam exciting at least one of said detector elements which thereby generates an output signal indicative of the deflected beam angle;
   second electron beam deflecting apparatus responsive to a periodic reference signal for simultaneously deflecting the beam in a second direction, orthogonal to the first direction, across the detector elements causing a time sample of the detected input signal to be generated of the output signal during a crossover time interval; and
   a binary encoder coupled to the output signal and generating a binary output signal corresponding to the time sample of the input signal.

2. An analog to digital converter according to claim 1 wherein the array of detector elements comprises a linear array of detector elements.

3. An analog to digital converter according to claim 1 wherein the periodic reference signal comprises a bipolar reference signal.

4. An analog to digital converter according to claim 3 wherein the periodic reference signal comprises a sinusoidal reference signal.

5. An analog to digital converter according to claim 1 wherein the detector elements are comprised of metal or semiconductor detector elements.

6. An analog to digital converter according to claim 1 and additionally including respective amplifier elements coupling the beam detector elements to the binary encoder.

7. An analog to digital converter according to claim 6 wherein the amplifier elements comprise unity gain buffer amplifier elements.

8. An analog to digital converter according to claim 6 wherein the amplifier elements comprise amplifier elements having a predetermined gain.

9. A method of converting an analog signal to a digital signal, comprising the steps of:
   generating an electron beam;
   locating an array of substantially equally spaced electron beam detector elements in the path of the electron beam;
   deflecting the beam in a first direction across the detector elements to a location proportional to the amplitude of the input signal;
   simultaneously deflecting the beam in a second direction, orthogonal to the first direction, across the detector elements in response to a periodic reference signal;
   exciting at least one of said detector elements and generating an output signal indicative of the deflected beam angle during a crossover time interval of the electron beam when deflected across the detector elements; and
   generating a binary output signal corresponding to the time sample of the input signal.

10. A method according to claim 9 wherein the array of detector elements comprises a linear array of detector elements.

11. A method according to claim 9 wherein the periodic reference signal comprises a bipolar reference signal.

12. A method according to claim 11 wherein the periodic reference signal comprises a sinusoidal reference signal.

13. A method according to claim 9 and additionally including the step of coupling respective amplifier elements to the binary encoder.

14. A method according to claim 13 wherein the amplifier elements comprise unity gain buffer amplifier elements.

15. A method according to claim 13 wherein the amplifier elements comprise amplifier elements having a predetermined gain.

* * * * *